United States Patent
Watts et al.

[11] Patent Number: 6,096,652
[45] Date of Patent: Aug. 1, 2000

[54] METHOD OF CHEMICAL MECHANICAL PLANARIZATION USING COPPER COORDINATING LIGANDS

[75] Inventors: David K. Watts; Janos Farkas; Jason Gomez, all of Austin; Chelsea Dang, Pflugerville, all of Tex.

[73] Assignee: Motorola, Inc., Schaumburg, Ill.

[21] Appl. No.: 08/963,438

[22] Filed: Nov. 3, 1997

[51] Int. Cl.[7] .................................................. H01L 21/00
[52] U.S. Cl. .......................... 438/692; 216/37; 216/89; 216/105; 252/79.4; 438/693; 438/754
[58] Field of Search .................... 438/690, 691, 438/692, 693, 745, 747, 754; 216/37, 88, 89, 105, 106; 252/79.1, 79.2, 79.4

[56] References Cited

U.S. PATENT DOCUMENTS

| | | | |
|---|---|---|---|
| 4,954,142 | 9/1990 | Carr et al. | 51/309 |
| 4,959,113 | 9/1990 | Roberts | 156/636 |
| 5,225,034 | 7/1993 | Yu et al. | 156/636 |
| 5,391,258 | 2/1995 | Brancaleoni et al. | 156/636 |
| 5,575,885 | 11/1996 | Hirabayashi et al. | 438/692 X |
| 5,773,364 | 6/1998 | Farkas et al. | 438/692 |
| 5,863,838 | 1/1999 | Farkas et al. | 438/693 |
| 5,897,375 | 4/1999 | Watts et al. | 438/693 |

OTHER PUBLICATIONS

K.B.Kaufman, et al., "Chemical–Mechanical Polishing for Fabricating Patterned W Metal Features as Chip Interconnects", J.Electrochem. Soc., vol. 138, No. 11, Nov., pp. 3460–3465 (1991).

D.Chadwick, et al., "Adsorbed Corrosion Inhibitors Studied by Electron Spectroscopy: Benzotriazole on Copper and Copper Alloys", Corrosion Science, vol. 18, pp. 39–51 (1978).

J.M.Steigerwald, et al., "Surface Layer Formation During the Chemical Mechanical Polishing of Copper Thin Films", Mat.Res.Soc.Symp.Proc.vol. 337, pp. 133–138 (1994).

M. Fleischmann, et al., "A Raman Spectroscopic Investivation of the Electropolymerization of Phenol on Silver Electrodes", Electrochimica Acta., vol. 28, No. 11, pp. 1545–1553 (1983).

*Primary Examiner*—William Powell

[57] ABSTRACT

A method of CMP of the semiconductor device where the method comprises the sequential steps of providing a semiconductor device, forming a copper layer on the semiconductor device and planarizing the copper layer with a medium. The medium comprises an abrasive component and a chemical solution. The chemical solution comprises water, an oxidizing agent, a first coordinating ligand adapted to form a complex with Cu(I) and a second coordinating ligand adapted to form a complex with Cu(II).

32 Claims, 3 Drawing Sheets

METHOD OF CHEMICAL MECHANICAL PLANARIZATION USING COPPER COORDINATING LIGANDS

FIELD OF THE INVENTION

The present invention relates generally to chemical mechanical planarization (CMP) of semiconductor devices and, more particularly, to a method of CMP that uses copper coordinating ligands in CMP slurries for planarizing copper layers.

BACKGROUND OF THE INVENTION

CMP is a well known process in the semiconductor industry used to remove and planarize layers of material deposited on a semiconductor device to achieve a planar topography on the surface of the semiconductor device. To remove and planarize the layers of deposited material, typical CMP, as depicted in prior art FIG. 1, involves wetting a pad 100 with a chemical slurry 110 containing abrasive components and mechanically "rubbing" or "buffing" a semiconductor device, usually found on a wafer 120, against the wet pad 100. The rubbing removes the layers of deposited materials on the front surface of the wafer 120 and planarizes the surface.

The planarizing is performed by rotating the carrier 130, holding the wafer 120, in a carrier rotational direction 140 and mechanically "rubbing" the wafer 120 against the pad 100. The wafer 120 rotates with the carrier 130 due to frictional forces between the carrier 130 and the wafer 120, in addition to a vacuum (not shown) within the carrier 130 holding the wafer 120. A platen 140 holds the pad 100 and rotates the pad 100 in a platen rotational direction 150 as the rotating wafer 120 is lowered in the contact direction 160 to contact the pad 100 and planarize the surface of the wafer 120. The types of deposited materials on the wafer 120 that are removed and planarized may include metal layers as well as dielectric layers that are on the front surface of the semiconductor device located on the wafer 120.

Certain relevant steps involved in the CMP of a metal layer, such as tungsten, are shown in prior art FIG. 2. FIG. 2 depicts cross-sectional views of the same semiconductor device portion undergoing certain relevant steps in the metal CMP of a tungsten metal layer 10. The tungsten metal layer 10 must be planarized down to a planarized level 40 above an insulator 45 by removing the excess tungsten metal 50. At the first step 60, the surface of the tungsten metal layer 10 has already been chemically converted by contact with a chemical slurry (not shown) to form a passivating layer 20. An oxidizing agent in the chemical slurry, such as ferric nitrate in the case of tungsten, chemically reacts with the tungsten to form the passivating layer 20 (tungsten oxide). The passivating layer 20 protects the recessed area 30 of the tungsten metal layer 10 from chemical erosion known as "dishing" since the recessed area 30 remains under the chemical slurry and would be subject to this dishing if not for the passivating layer 20.

In step 70, the passivating layer 20 has been removed by the mechanical rubbing, as discussed above in the CMP process, of the elevated area 35 of step 60. Step 80 depicts the reformation of the passivating layer 20 over the elevated area 35 as the CMP process continues since the chemical slurry is consistently being deposited on the surface of the tungsten metal layer 10 and thereby chemically reacting with the metal layer 10 to form the passivating layer 20. Steps 60 to 80 are repeatedly performed until the excess tungsten metal 50 is removed as depicted in step 90 where the CMP ends.

During this tungsten CMP, the recessed area 30 is well protected from any chemical recess by the chemical slurry into the tungsten metal layer 10, i.e. "dishing", by the tungsten oxide (passivating layer 20). Such dishing may lead to electrical problems (e.g. high line resistance) and undesirable topography of the device causing degraded device performance. Furthermore, the passivating layer prevents metal corrosion of the metal layer 10 which, if not prevented, can also lead to device failure. The passivating layer 20 therefore helps achieve a reliable device with excellent planarity, all at a high polishing rate.

While the formation of a passivating layer 20 for tungsten metal layers results in a reliable device, the formation of a passivating layer for a copper metal layer has particular problems—first, the copper oxide formed during copper CMP is not sufficiently passivating to prevent penetration of the chemical slurry into the copper metal layer. This is likely due to the fact that copper oxide may exist in two forms, Cu(I) oxide and Cu(II) oxide, which, when both forms are present in a given copper oxide layer, the copper oxide layer is porous in nature. A chemical slurry used during copper CMP forms a copper oxide, much like a tungsten oxide is formed for a tungsten metal, but unlike the tungsten oxide, the copper oxide does not sufficiently passivate the copper metal in the recessed area. This is because the chemical etching will occur in the recessed areas due to the penetration of the chemical slurry into the porous copper layer. As such, the copper oxide causes chemical recess into the copper layer thereby causing corrosion of the copper layer. This may result in device failure.

A further problem is that the removal rate of the copper oxide is not sufficiently fast enough to satisfy manufacturing requirements. Generally, a rapid removal rate in Angstroms per minute is very important to the design of a CMP process since a rapid removal rate increases the throughput of the wafers undergoing the CMP process. While the removal rate of tungsten oxide has achieved a satisfactory removal rate, such a removal rate for copper oxide has not.

Prior art literature has suggested that the addition to the chemical slurry of an inhibitor during copper CMP, such as benzotriazole (BTA), may assist in passivating the copper layer during the copper CMP. However, it is not clear whether the inhibitor provides uniform coverage over the entire copper layer, that is over both the elevated area and recessed areas of the copper surface, or whether the inhibitor allows for a rapid removal rate. BTA is known to form a complex with a copper ion having a positive one charge (Cu(I)) more readily than with a copper ion having a positive two charge (Cu(II)) at copper surfaces. Furthermore, amines are known to form complexes with Cu(II) and it has also been shown that the addition of both benzylamine and BTA to a chemical solution can enhance the anticorrosive ability of the solution on the copper surface, however the reason for this effect remains unclear. The effect of a Cu(I) and Cu(II) in the chemical slurry is not known.

A need therefore exists for a method of CMP of a copper metal layer that provides rapid removal rate of the copper oxide and provides a passivating layer over the entire copper surface to protect recessed areas from further chemical etching and/or copper corrosion during the CMP process. The chemical recess must be avoided since such a recess may lead to higher line resistance and undesirable topography which makes process integration difficult, causing degraded device performance and/or yield loss. Further, the copper oxide produced in the corroded copper can also lead to higher resistance and decreased yield. Finally, integratability of the inlaid back-end process depends on the ability to produce highly planar surfaces.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION OF A PREFERRED EMBODIMENT

In the following description, various embodiments and an Example of the method of CMP of a semiconductor device will be detailed. It is understood, however, that the present invention is directed to a method of CMP of the semiconductor device where the method comprises the sequential steps of providing a semiconductor device, forming a copper layer on the semiconductor device and planarizing the copper layer with a medium. The medium comprises an abrasive component and a chemical solution. The chemical solution comprises water, an oxidizing agent, a first coordinating ligand adapted to form a complex with Cu(I) and a second coordinating ligand adapted to form a complex with Cu(II). From the Example provided below, it is shown that a semiconductor device undergoing the CMP method of the present invention achieves a rapid removal rate, and significantly lowered corrosion, of the copper layer as compared to a CMP method that uses no Cu(I) or Cu(II) coordinating ligands, or only one of such coordinating ligands, in the medium. Such Example indicates that the medium containing the coordinating ligands to Cu(I) and Cu(II) provide for complete surface coverage of the copper layer to thereby passivate the entire surface and prevent copper corrosion. The method of the present invention will now be described in detail with reference to FIGS. 3–7.

Figure 3:
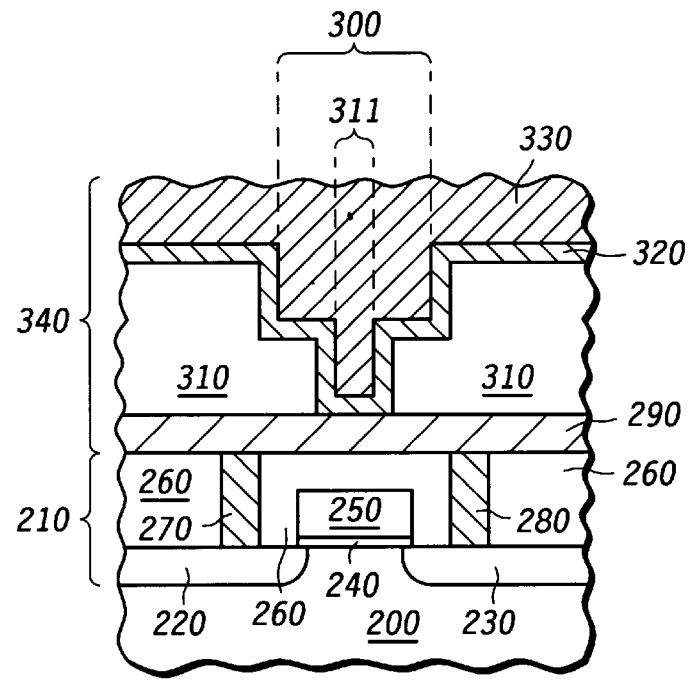
FIG. 3 is a cross-sectional view of a semiconductor device to be planarized using the CMP method of the present invention.

FIG. 3 is a cross-sectional view of a semiconductor device to be planarized using the CMP method of the present invention. A substrate 200, e.g. silicon, has an active device 210 formed thereon. The substrate 200 may also be a single crystal silicon, germanium, germanium/silicon, gallium arsenide, polysilicon or silicon on insulator. The active device 210 is formed in a conventional manner used to form semiconductor transistors such as a metal oxide semiconductor. The active device 210 has a source region 220, a drain region 230, a gate oxide 240 and a gate polysilicon 250 (which form the gate stack). First dielectric layer 260 is formed around the gate stack and overlying the substrate 200 to isolate the gate stack. It is understood that by overlying the substrate 200, it is meant that the first dielectric layer 260 is over or on the substrate 200. As such, even the second dielectric layer 310 is considered to overlie the substrate 200.

A source region contact 270 and drain region contact 280, each being a conducting via such as copper, are used to provide a bias to the active device 210. The contacts 270 and 280 make contact with a second conducting layer 290, e.g. a copper layer, thereby providing ohmic contact, i.e. a contact wherein the resistance is proportional to the current, between the active device 210 and the second conducting layer 290. The semiconductor device, at the level of the second conducting layer 290 down to the substrate 200, is considered a semiconductor structure in the present embodiment. Above the second conducting layer 290 is formed a via 311 and trench 300 that is formed using standard semiconductor fabrication techniques. The trench 300, contiguous with the via 311, is surrounded by a second dielectric layer 310 and has a barrier/glue layer 320 between a copper layer 330 and the second dielectric layer 310. The barrier/glue layer 320 is, for example, tantalum nitride, however, titanium, titanium silicon nitride, titanium nitride, tantalum silicon nitride and other tantalum based alloys may also by used. A copper layer 330 is deposited over the barrier/glue layer 320 at the top of the semiconductor device. It is understood that while the copper layer 330, not the conducting layer 290, is to be planarized in the embodiment shown in FIG. 3, the conducting layer 290 may also be subjected to the planarization method of the present invention in a further embodiment. The second portion 340 of the semiconductor device of FIG. 3 is exploded below in FIG. 4 to more clearly understand the CMP method of the present invention.

Figure 1:
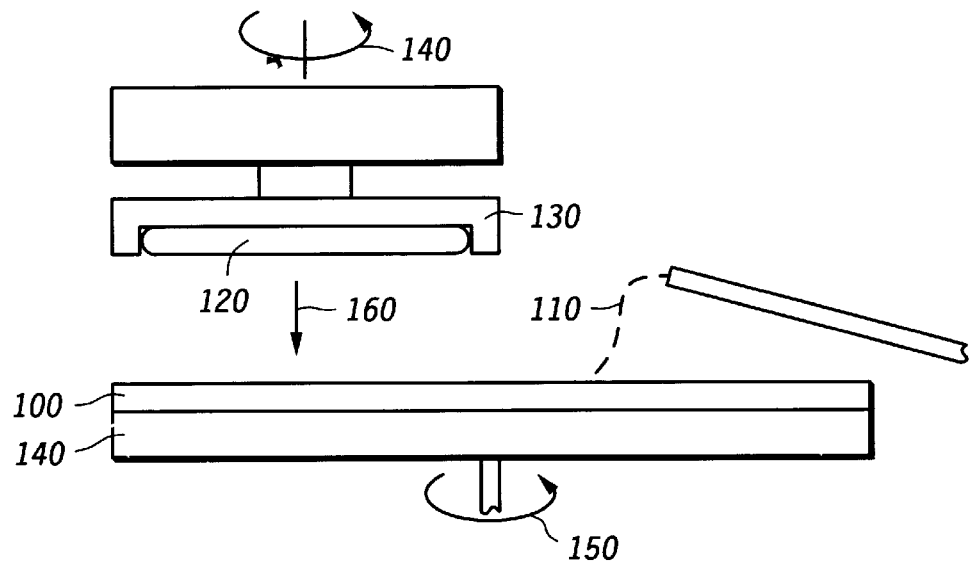
FIG. 1 is a prior art schematic view of a typical CMP process.
Figure 2:
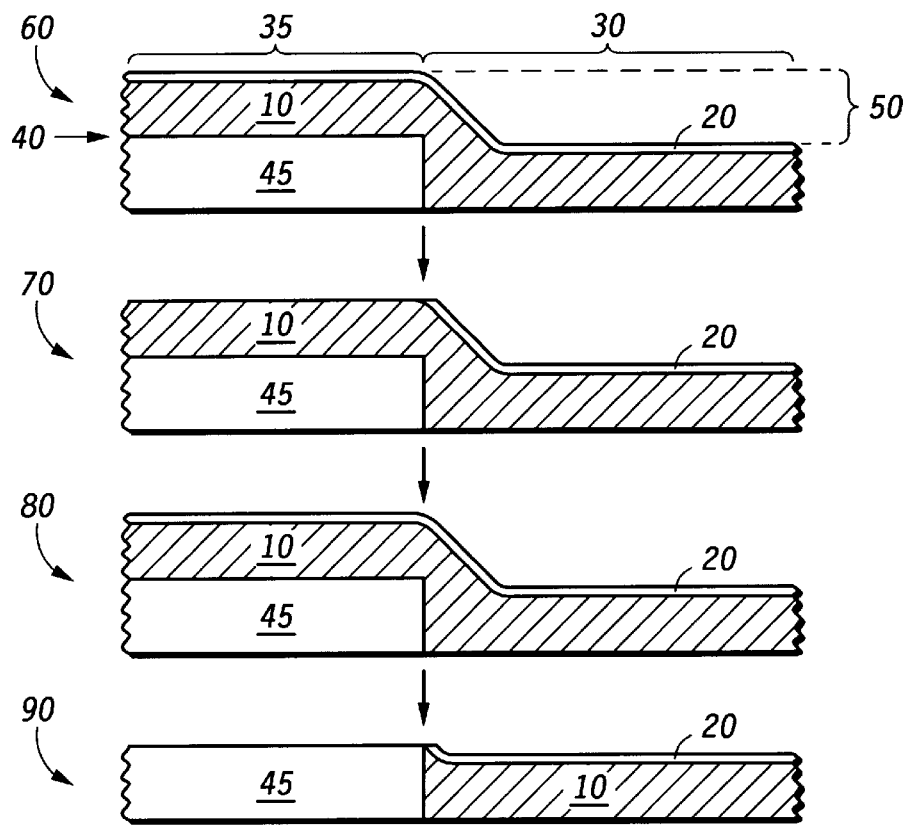
FIG. 2 is a prior art cross-sectional view of various relevant steps of a typical semiconductor device portion undergoing the CMP process of FIG. 1.
Figure 4:
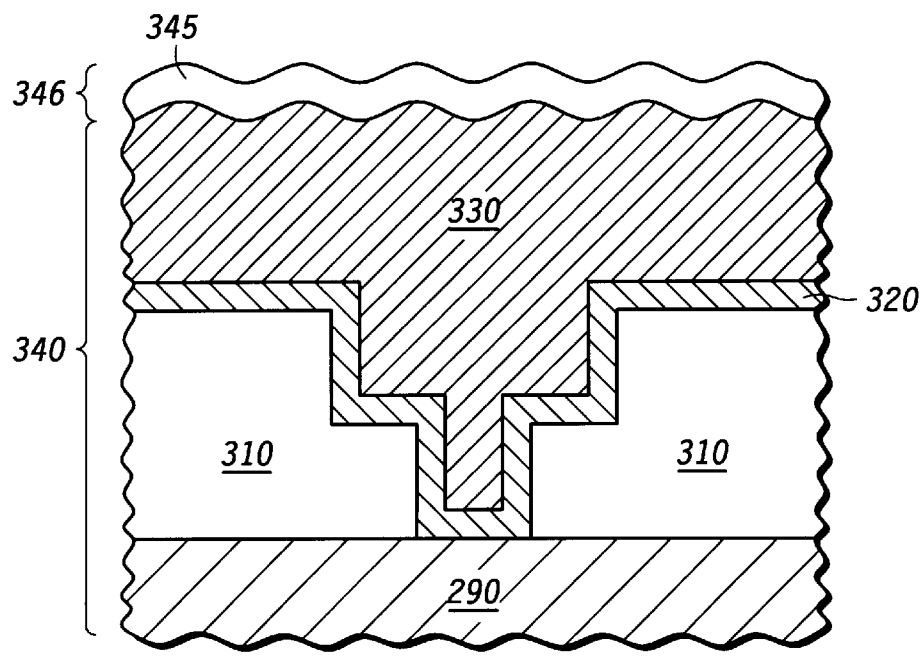
FIG. 4 is an exploded cross-sectional view of a portion of the semiconductor device depicted in FIG. 3 that is to be planarized using the CMP method of the present invention.

FIG. 4 is an exploded cross-sectional view of the second portion 340 of the semiconductor device depicted in FIG. 3 that is to be planarized using the CMP method of the present invention. A medium 345 has been added to the second portion 340 on the top surface of the copper layer 330 that will be used in the CMP method of the present invention. Medium 345 is composed of two components—an abrasive component (not shown) and a chemical solution (not shown). The abrasive component includes abrasive particles such as alumina, silica, metal oxides or other such particles that are capable of wearing, grinding or rubbing away other elements by friction, including an abrasive pad. The chemical solution is composed of an oxidizing agent, water, a first coordinating ligand that is adapted to form a complex with Cu(I) and a second coordinating ligand that is adapted to form a complex with Cu(II). The medium 345 is used in, for example, a CMP process, as in prior art FIG. 1, where the medium 345 is put on a pad and mechanically "rubbed" or "buffed" against a semiconductor device, usually found on a wafer, against the wet pad. The rubbing removes the layers of deposited materials on the front surface of the wafer and planarizes the surface. However, unlike the prior art, the medium 345 provides improved passivation over the copper layer 330, thereby preventing contamination of the copper layer 340, and further achieves more rapid removal rates than prior art mediums, or slurries.

Figure 5:
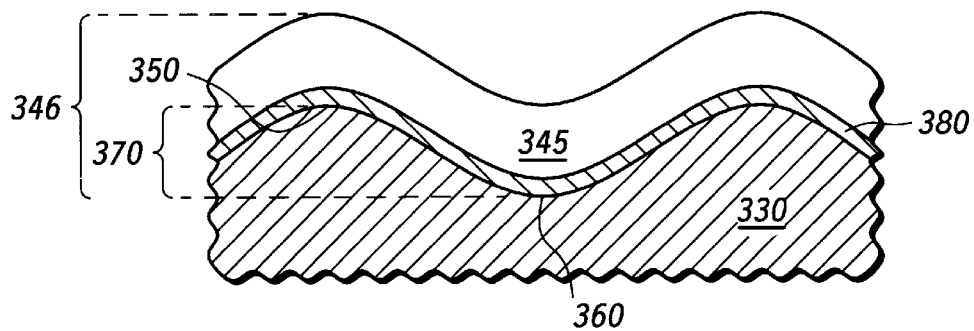
FIG. 5 is an exploded cross-sectional view of the surface of the semiconductor device of FIG. 4 having a medium over the metal surface that is used in the CMP method of the present invention.

FIG. 5 is a further exploded cross-sectional view of the surface of the semiconductor device of FIG. 4 having a medium 345, that includes the passivating-type layer 380, over the semiconductor surface of the copper layer 330 that is used in the CMP method of the present invention. From FIG. 5, it is believed that the Cu(I) and Cu(II) coordinating ligands in the medium 345 help form a passivating-type layer 380 at the surface of the copper layer 330 to prevent corrosion of the copper layer 330 by the medium 345. The passivating-type layer 380 is a copper oxide, in addition to having the Cu(I) and Cu(II) coordinating ligands forming Cu(I) and Cu(II) complexes at the copper surface which helps form a more effective passivating layer. In FIG. 5, an elevated point 350 is an elevation distance 370 from a recessed point 360 along the surface of the copper layer 330. As the CMP of the copper layer 330 occurs, the pad (not shown), as described in prior art FIG. 1, and medium 345 begin to planarize the elevated point 350 before planarizing the recessed point 360. However, at all times, the medium 345 is over the recessed point 360 and therefore would corrode the copper layer 330, if not for the passivating layer 380 formed by the first coordinating ligand forming a complex with Cu(I), and second coordinating ligand forming a complex with Cu(II). The passivating-type layer 380 is shown in FIG. 5 as a separate layer, mainly a copper oxide. However, it should be noted that the first and second coordinating ligands may not necessarily form such a separate layer in the medium 345, but is believed to contribute to the passivation of the copper layer 330 as shown by the Example below.

Figure 6:
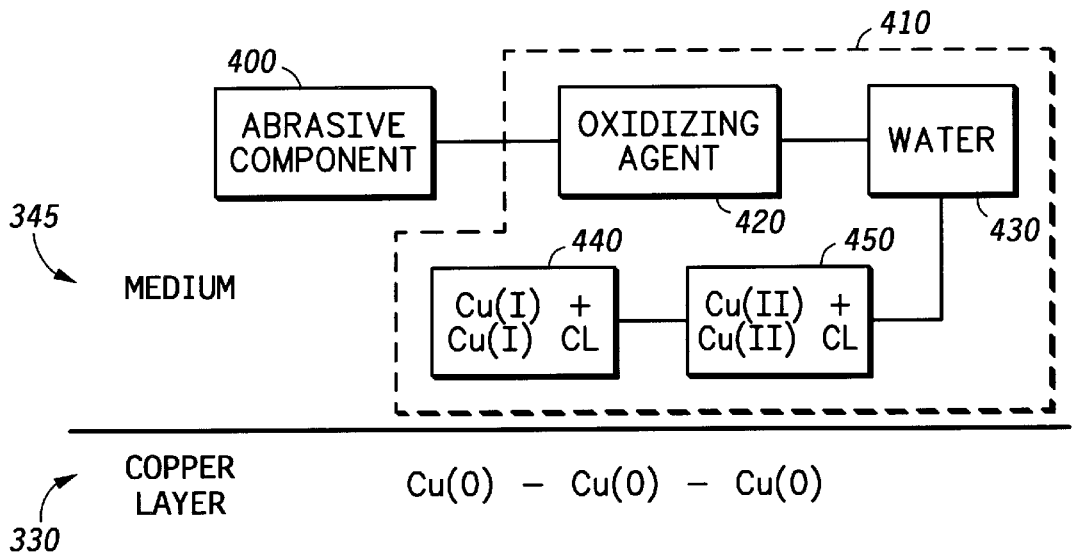
FIG. 6 is an schematic view of the surface of the semiconductor device of FIG. 5 having a medium over the semiconductor surface that is used in the CMP method of the present invention.

FIG. 6 is an exploded schematic view of the third portion 346 of the surface of the semiconductor device of FIGS. 4 and 5 having the medium 345 over the semiconductor surface that is used in the CMP method of the present invention. From the schematic view of FIG. 6, the medium 345 and the copper layer 330 have been exploded. The copper layer 330 is simply a metallic copper in a non-ionic state or symbolically Cu(0). The medium 345 has an abrasive component 400 and a chemical solution 410 represented in diagram form. The abrasive component 400 includes abrasive particles such as alumina, silica, metal oxides or other such particles that are capable of wearing, grinding or rubbing away other elements by friction, including an abrasive pad. An abrasive component 400 and a chemical solution 410 may be provided in a slurry. The chemical solution 410 is composed of an oxidizing agent 420, water 430, a first coordinating ligand that is adapted to form a complex with Cu(I) 440 and a second coordinating ligand that is adapted to form a complex with Cu(II) 450. Coordinating ligands are compounds, consisting of ions or molecules capable of coordinating to a central atom or molecule, such as Cu(I) or Cu(II) in the present invention, in a complex. Specifically, for a metal coordinating ligand, there may be one, two, four, five, six and sometimes more ligands positioned geometrically around the metal ion. The ligand may be neutral molecules, cations or anions. Each coordinating ligand may be a separate entity, or all the coordinating groups can be connected in one-long, flexible molecule that wraps itself around the metal. Coordinating ligands change significantly the chemical behavior of the metal. A complex is a chemical association of two or more species (as ions or molecules) joined, usually by coordinate covalent or dative bonds.

The oxidizing agent 420 is selected from a group consisting of any of the following materials: peroxides, persulfates, periodates, and nitrates. The oxidizing agent is, for example, hydrogen peroxide. The first coordinating ligand that is adapted to form a complex with Cu(I), i.e. the first coordinating ligand that preferably binds to Cu(I) over Cu(II), is selected from a group consisting of any of the following materials: benzotriazole, triazoles, imidazoles, mercaptans, amides, halides, cyanides, thiocyanides, thioethers, and combinations thereof. Chelating agents containing such functional groups and structures as to make them specific for binding to Cu(I) may also be used as first coordinating ligands. The triazole, when used as a first coordinating ligand, may be a 1,2,4-triazole. The second coordinating ligand that is adapted to form a complex with Cu(II) 450, i.e. the second coordinating ligand that preferably binds to Cu(II) over Cu(I), is selected from a group consisting of any of the following materials: amines, carboxylates, sulfides, and combinations thereof. Chelating agents containing such functional groups (e.g. electron donating sulfur, oxygen or nitrogen groups) and structure so they are capable of binding to Cu(II) may also be used as second coordinating ligands. Further, the second coordinating ligand may also be a carboxylate such as ammonium citrate, oxalate and succinate, or an amine such as benzylamine. Both the first coordinating ligand and the second coordinating ligand have concentrations in the medium in the range of between 0.001 moles per liter (M) and 1.0M. The oxidizing agents have concentrations in the medium in the range between 0.1 percent by weight to 10 percent by weight. The pH of the medium is in the range between 4 to 9.

Figure 7:
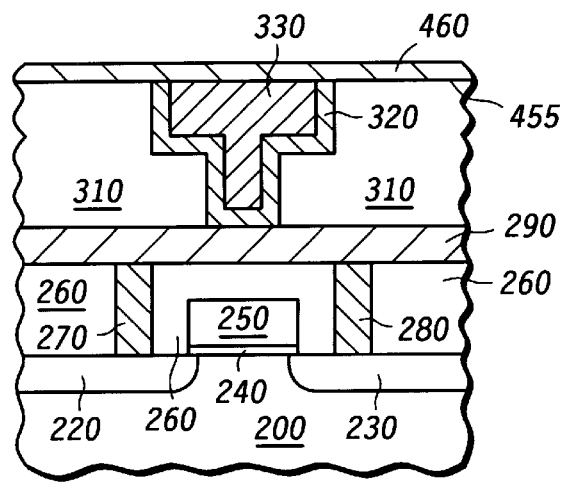
FIG. 7 is a cross-sectional view of the semiconductor device after undergoing the CMP method of the present invention.

FIG. 7 is a cross-sectional view of the semiconductor device after undergoing the CMP method of the present invention. The method of CMP of the present invention has resulted in a planar top surface 455 on the semiconductor device. An additional passivation/metallization layer 460, which may be several layers, is then applied to the planar top surface 455.

Certain embodiments of the present invention will now be described in more detail in the following Example.

EXAMPLE

A copper layer on a wafer was polished using an IPEC 472 polishing tool under the following process conditions and using the following compounds in the medium (slurry) to achieve the following average copper removal rate (Avg. Cu Rate in Å/min.), copper corrosion (Cu dishing in Å in 100 micron pad), silicon dioxide removal rate (Avg. Dielectric Rate in Å/min.), and silicon dioxide erosion (Dielectric Erosion in Å in 0.36 micron lines/0.27 micron space).

Process Conditions

| Polishing Pad | Rodel IC1400 |
|---|---|
| Arm Pressure | 4 psi |
| Back Pressure | 1 psi |
| Platen Speed | 49 Revolutions per minute (RPM) |
| Carrier Speed | 41 RPM |
| Abrasive Slurry | Cabot WA355 (alumina) |

Compounds in Medium and Results

| (1) | Cu(II) Coordinating Ligand | Ammonium Citrate | 0.025M |
|---|---|---|---|
| | Cu(I) Coordinating Ligand | None | |
| | Oxidizing Agent | Hydrogen Peroxide | 1% |
| | pH | 7.5 | |
| | Avg. Cu Rate | 4200 | |
| | Avg. Dielectric Rate | 300 | |
| | Cu Dishing | 2000 | |
| | Dielectric Erosion | 1200 | |
| (2) | Cu(II) Coordinating Ligand | Ammonium Citrate | 0.05M |
| | Cu(I) Coordinating Ligand | None | |
| | Oxidizing Agent | Hydrogen Peroxide | 1% |
| | pH | 7.0 | |
| | Avg. Cu Rate | 9500 | |
| | Avg. Dielectric Rate | 240 | |

-continued

|  |  |  |  |
|---|---|---|---|
|  | Cu Dishing | 3000 |  |
|  | Dielectric Erosion | 1500 |  |
| (3) | Cu(II) Coordinating Ligand | Ammonium Citrate | 0.05M |
|  | Cu(I) Coordinating Ligand | Benzotriazole | 3.0 mM |
|  | Oxidizing Agent | Hydrogen Peroxide | 1% |
|  | pH | 6.8 |  |
|  | Avg. Cu Rate | 4300 |  |
|  | Avg. Dielectric Rate | 220 |  |
|  | Cu Dishing | 1500 |  |
|  | Dielectric Erosion | 700 |  |
| (4) | Cu(II) Coordinating Ligand | Ammonium Citrate | 0.05M |
|  | Cu(I) Coordinating Ligand | 1,2,4-triazole | 0.1M |
|  | Oxidizing Agent | Hydrogen Peroxide | 2% |
|  | pH | 7.5 |  |
|  | Avg. Cu Rate | 4000 |  |
|  | Avg. Dielectric Rate | 150 |  |
|  | Cu Dishing | 1500 |  |
|  | Dielectric Erosion | 700 |  |

These results show that the combination of a Cu(I) and Cu(II) coordinating ligands in the medium (Results 3 and 4) used for CMP results in rapid copper removal rates as well as significantly less copper dishing (corrosion). The dielectric erosion has also significantly improved.

The method of the present invention has been described in connection with the preferred embodiments as disclosed herein. Although an embodiment of the present invention has been shown and described in detail, along with variances thereof, many other varied embodiments that incorporate the teachings of the invention may be easily constructed by those skilled in the art that may fall within the scope of the present invention as claimed below.

We claim:

1. A method of chemical mechanical planarization of a semiconductor device, comprising the sequential steps of:
   providing a semiconductor device;
   forming a copper layer on the semiconductor device; and
   planarizing said copper layer with a medium, said medium comprising an abrasive component and a chemical solution, said chemical solution comprising:
   water;
   an oxidizing agent;
   a first coordinating ligand; and
   a second coordinating ligand, wherein said first coordinating ligand is adapted to form a complex with Cu(I), and the second coordinating ligand is adapted to form a complex with Cu(II).

2. The method of claim 1, wherein the first coordinating ligand comprises a material from the group consisting of triazoles, imidazoles, mercaptans, amides, halides, cyanides, thiocyanides, thioethers, and combinations thereof.

3. The method of claim 2, wherein the first coordinating ligand comprises a triazole.

4. The method of claim 3, wherein the first coordinating ligand comprises 1,2,4-triazole.

5. The method of claim 3, wherein the first coordinating ligand comprises benzotriazole.

6. The method of claim 3, wherein the first coordinating ligand comprises imidazole.

7. The method of claim 1, wherein the second coordinating ligand comprises a material from the group consisting of amines, carboxylates, sulfides, and combinations thereof.

8. The method of claim 7, wherein the second coordinating ligand comprises a material from the group consisting of amines, and carboxylates.

9. The method of claim 8, wherein the second coordinating ligand comprises a carboxylate, said carboxylate being a citrate.

10. The method of claim 8, wherein the second coordinating ligand comprises, an amine, said amine being benzylamine.

11. The method of claim 1, wherein said chemical solution comprise a slurry in which the abrasive component is provided.

12. The method of claim 1, wherein the oxidizing agent comprises a material selected from the group consisting of peroxides, persulfates, periodates, and nitrates.

13. The method of claim 12, wherein the oxidizing agent comprises hydrogen peroxide.

14. The method of claim 1, wherein the abrasive component comprises a material from the group consisting of silica and alumina.

15. A method of forming a semiconductor device, comprising the steps of:
   (i) forming a semiconductor structure, comprising the substeps of:
      providing a substrate;
      forming an active device on said substrate;
      depositing a dielectric layer overlying said substrate;
      forming a via in said dielectric layer; and
      forming a copper layer over said dielectric layer and in said via; and
   (ii) planarizing said copper layer with a medium, said medium comprising an abrasive component and a chemical solution, said chemical solution comprising:
      water;
      an oxidizing agent;
      a first coordinating ligand; and
      a second coordinating ligand, wherein said first coordinating ligand is adapted to form a complex with Cu(I), and the second coordinating ligand is adapted to form a complex with Cu(II).

16. The method of claim 15, further comprising forming a trench in the dielectric layer, said trench being contiguous with the via, wherein the copper layer extends into the trench.

17. The method of claim 16, wherein the copper layer is formed by depositing, such that the copper layer is simultaneously deposited in the via and the trench.

18. The method of claim 15, wherein the substrate comprises silicon.

19. The method of claim 15, wherein the via extends through the dielectric layer such that the copper layer formed therein makes ohmic contact with the active device.

20. The method of claim 15, wherein the first coordinating ligand comprises a material from the group consisting of triazoles, imidazoles, mercaptans, amides, halides, cyanides, thiocyanides, thioethers, and combinations thereof.

21. The method of claim 20, wherein the first coordinating ligand comprises a triazole.

22. The method of claim 21, wherein the first coordinating ligand comprises 1,2,4-triazole.

23. The method of claim 20, wherein the first coordinating ligand comprises benzotriazole.

24. The method of claim 20, wherein the first coordinating ligand comprises imidazole.

25. The method of claim 15, wherein the second coordinating ligand comprises a material from the group consisting of amines, carboxylates, sulfides, and combinations thereof.

26. The method of claim 25, wherein the second coordinating ligand comprises a material from the group consisting of amines and carboxylates.

27. The method of claim 26, wherein the second coordinating ligand comprises a carboxylate, said carboxylate being a citrate.

28. The method of claim 25, wherein the second coordinating ligand comprises, an amine, said amine being benzylamine.

29. The method of claim 15, wherein said chemical solution comprise a slurry in which the abrasive component is provided.

30. The method of claim 15, wherein the oxidizing agent comprises a material selected from the group consisting of peroxides, persulfates, periodates, and nitrates.

31. The method of claim 30, wherein the oxidizing agent comprises hydrogen peroxide.

32. The method of claim 15, wherein the abrasive component comprises a material from the group consisting of silica and alumina.

* * * * *